United States Patent
Price et al.

(10) Patent No.: US 6,724,239 B2
(45) Date of Patent: Apr. 20, 2004

(54) VOLTAGE BOOST CIRCUIT AND LOW SUPPLY VOLTAGE SAMPLING SWITCH CIRCUIT USING SAME

(75) Inventors: Colin Price, Newbury Berks (GB); Mark Stephen Power, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/156,613

(22) Filed: May 28, 2002

(65) Prior Publication Data

US 2003/0020533 A1 Jan. 30, 2003

Related U.S. Application Data

(60) Provisional application No. 60/307,456, filed on Jul. 24, 2001.

(51) Int. Cl.[7] .............................. G05F 1/10; G05F 3/02
(52) U.S. Cl. ........................ 327/536; 327/589; 327/534
(58) Field of Search ................................ 327/534, 535, 327/536, 537, 589, 390; 363/59, 60

(56) References Cited

U.S. PATENT DOCUMENTS

| | | | | |
|---|---|---|---|---|
| 5,604,671 A | * | 2/1997 | Okamura | 363/60 |
| 5,912,560 A | * | 6/1999 | Pasternak | 324/536 |
| 6,060,938 A | * | 5/2000 | Morrill | 327/391 |
| 6,118,326 A | | 9/2000 | Singer et al. | 327/390 |
| 6,130,574 A | * | 10/2000 | Bloch et al. | 327/536 |
| 6,448,841 B1 | * | 9/2002 | Milazzo | 327/536 |
| 6,452,438 B1 | * | 9/2002 | Li | 327/536 |
| 2002/0114199 A1 | * | 8/2002 | Negoi | 365/200 |

FOREIGN PATENT DOCUMENTS

EP 391063 A * 10/1990 ............. E05C/9/02

OTHER PUBLICATIONS

Pierre Favrat et al., *A High Efficiency CMOS Voltage Doubler*, vol. 33, No. 3, IEEE Journal of Solid–State Circuits, 410 (Mar. 1998).

Yoshinobu Nakagome et al., *An Experimental 1.5–V 64–Mb DRAM*, vol. 26, No. 4, IEEE Journal of Solid–State Circuits, 465 (Apr. 1991).

Thomas B. Cho & Paul R. Gray, *A 10–bit, 20–MS/s, 35–mW Pipeline A/D Converter*, IEEE 1994 Custom Integrated Circuits Conference, pp 499–501.

* cited by examiner

*Primary Examiner*—Tuan T. Lam
*Assistant Examiner*—Quan Tra
(74) *Attorney, Agent, or Firm*—Iandiorio & Teska

(57) ABSTRACT

A voltage boost circuit includes a boost capacitor; a charge circuit for charging in the charging mode the boost capacitor to a supply voltage, the charging circuit including a charging MOS switch interconnected between the supply voltage and one terminal of the boost capacitor and a back gate isolation circuit connected to the back gate of the charging MOS switch and including a first switch for connecting the back gate to the supply voltage for reverse biasing the back gate in the charging mode and the second switch for connecting the back gate to the one terminal of the boost capacitor for reverse biasing the back gate in the boost mode to prevent charge loss from the boost capacitor; and a boost bias voltage and a boost switch for connecting the second terminal of the boost capacitor to the boost bias voltage in the boost mode.

18 Claims, 5 Drawing Sheets

GATE BOOSTING SCHEME

# VOLTAGE BOOST CIRCUIT AND LOW SUPPLY VOLTAGE SAMPLING SWITCH CIRCUIT USING SAME

RELATED APPLICATIONS

This application claims priority of U.S. Provisional application No. 60/307,456 filed Jul. 24, 2001 to Price et al. entitled LOW-VOLTAGE CMOS SAMPLING TECHNIQUE ALLOWING POWER-DOWN OPERATION AND WIDE SUPPLY RANGE FUNCTIONALITY.

FIELD OF THE INVENTION

This invention relates to a voltage boost circuit, and more particularly to a low supply voltage sampling switch circuit using such a voltage boost circuit.

BACKGROUND OF THE INVENTION

Voltage sampling switch circuits such as used in analog to digital converters (ADC) are desired to conduct even when the input voltage is close to or exceeds the supply voltage. This is becoming more of a challenge as the demand increases for circuits that operate at ever lower supply voltages. Presently, there are no practical 12 bit ADC's which operate at 1.6 volts although they are in demand. In one approach a transmission gate using a parallel PMOS, NMOS pair works well when the supply voltage is high but the conductance goes to zero about midband of the input when the supply voltage is in the 1.8 volt range. Another approach to the problem, Singer et al., U.S. Pat. No. 6,118, 326, employs a boost capacitor which is charged to supply voltage in one mode then stacked on the analog input voltage to provide a fixed enhancement to the gate voltage of the sampling switch to maintain near constant conduction over the input range. One problem with this is that with positive supply voltage using an NMOS switch to connect the boost capacitor to the supply voltage another boost circuit is needed to keep the gate of this NMOS switch above the supply so that the boost capacitor can be sufficiently charged. This uses additional power and requires a clock to constantly recharge this additional boost circuit. In the situation of a positive supply voltage this problem can be alleviated by using a PMOS instead of an NMOS switch but then the back gate of the PMOS normally connected to the source terminal acts as a forward biased diode in the boost mode and quickly discharges the boost capacitor. Other circuits, Pierre Favrat et al., IJSSC March 1998, double the supply voltage to drive the gate. The problem with this is that the boosted voltage can in some conditions of input voltage exceed the maximum voltage rating of the MOS devices and so further adjustment is required to accommodate this. See U.S. Pat. No. 6,118,326 to Singer et al., issued Sep. 12, 2000, entitled *Two Phase Boostrap CMOS Switch Drive Technique and Circuit*. See also *A High Efficiency CMOS Voltage Doubler* (Pierre Favrat et al., IJSSC March 1998); *a 10-bit 20-MS/s, 35 mw Pipeline A/D Converter* (Cho et al., IEEE 1994 custom IC Conf.); and *An Experimental 1.5v 64-Mb DRAM* (Nakagome et al., IJSSC April 1991).

BRIEF SUMMARY OF THE INVENTION

It is therefore an object of this invention to provide an improved voltage boost circuit.

It is a further object of this invention to provide an improved low supply voltage sampling switch circuit using such a voltage boost circuit.

It is a further object of this invention to provide such an improved voltage boost circuit and low supply voltage sampling switch circuit using such a voltage boost circuit which operate over a wider supply voltage range.

It is a further object of this invention to provide such an improved voltage boost circuit and low supply voltage sampling switch circuit using such a voltage boost circuit which do not require a continuous clock or additional boost circuitry.

It is a further object of this invention to provide such an improved voltage boost circuit and low supply voltage sampling switch circuit using such a voltage boost circuit which stacks the boost capacitor voltage on a fixed bias to ensure that the boosted voltage does not exceed a maximum safe voltage for the MOS devices.

The invention results from the realization that a high voltage boost circuit particularly useful in a low supply voltage sampling switch circuit which uses less power, does not require a continuous clock and operates over a wider range of voltages can be achieved by using a back gate isolation circuit for switching the back gate of a charging MOS switch to reverse bias it both during the charging and the boost modes to prevent charge loss of the capacitor during the boost mode.

This invention features a voltage boost circuit including a boost capacitor and a charging circuit for charging in the charging mode the boost capacitor to a supply voltage. The charging circuit includes a charging MOS switch interconnected between the supply voltage and one terminal of the boost capacitor. There is a boost bias voltage and a boost switch for connecting the second terminal of the boost capacitor to the boost bias voltage in the boost mode. The charging circuit also includes a back gate isolation circuit connected to the back gate of the charging MOS switch and includes a first switch for connecting the back gate to the supply voltage for reverse biasing the back gate in the charging mode and a second switch for connecting the back gate to the one terminal of the boost capacitor for reverse biasing the back gate in the boost mode to prevent charge loss from the boost capacitor.

In a preferred embodiment correct level driving signals are achieved by connecting the last stage of the driving circuit to one terminal of the boost capacitor to provide a driving voltage that is always equal to the largest voltage in the circuit. The supply voltage may be positive and the charging MOS switch may include a PMOS switch. The supply voltage may be negative and the charging MOS switch may include an NMOS switch. The first and second switches each may have their back gates connected to the back gate of the charging MOS switch.

This invention also features a low supply sampling switch circuit with a voltage boost circuit including a boost capacitor and a charging circuit for charging in a charge mode the boost capacitor to a supply voltage. The charging circuit includes a charging MOS switch interconnected between the supply voltage and one terminal of the boost capacitor. There is a boost bias voltage and a boost switch for connecting the second terminal of the boost capacitor to the boost bias voltage in the boost mode. The charging circuit also includes a back gate isolation circuit connected to the back gate of the PMOS switch and includes a first switch for connecting the back gate to the supply voltage for reverse biasing the back gate in the charging mode and a second switch for connecting the back gate to the terminal of the boost capacitor for reverse biasing the back gate in the boost mode to prevent charge loss from the boost capacitor. There is an MOS sampling switch and a boost switch for interconnecting in the boost mode the one terminal of the boost capacitor with the gate of the sampling switch for maintaining the sampling switch in the conducting state.

In a preferred embodiment the supply voltage may be positive, the charging MOS switch may be a PMOS switch and the MOS sampling switch may be an NMOS switch and the sampling switch may conduct even at higher input voltages. The supply voltage may be negative, the charging MOS switch may be an NMOS switch and the MOS sampling switch may be a PMOS switch and the sampling switch may conduct even at lower input voltages. The first and second switches may each have their back gates connected to the back gate of the charging MOS switch.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
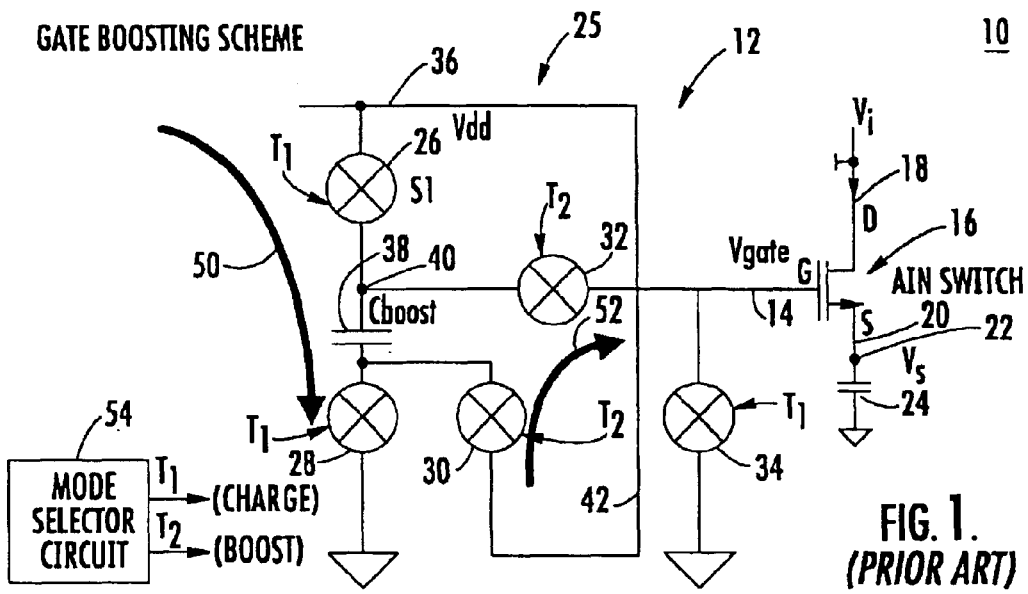
FIG. 1 is a simplified block diagram of a prior art voltage boost circuit used in a voltage sampling circuit.

There is shown in FIG. 1 a prior art voltage sampling switch circuit 10 including a voltage boost circuit 12 for providing a control voltage to gate 14 of analog output switch 16 which receives the voltage input $V_i$ to be sampled at drain 18, over source 20 to terminal 22 where the sampling voltage $V_S$ is stored on sampling capacitor 24. Voltage boost circuit 12 includes a charging circuit 25 including charging MOS switch 26 and four other MOS switches 28, 30, 32, and 34. Charging MOS switch 26 is connected between supply voltage 36 $V_{dd}$ and boost capacitor 38 at one terminal 40. The other terminal of boost capacitor 38 is connected to ground through switch 28 or through switch 30 over line 42 to the supply voltage $V_{dd}$ at 36. One problem with the use of the supply voltage $V_{dd}$ in this way is that the voltage on gate 14 may exceed the maximum operating voltages for MOS devices in the circuit and so additional precautions must be taken against this eventuality. Switch 34 for example will see nearly twice $V_{dd}$ across it. Switch 32 interconnects terminal 40 of boost capacitor 38 to gate 14 of analog input switch 16 and switch 34 selectively connects gate 14 to ground.

Figure 2:
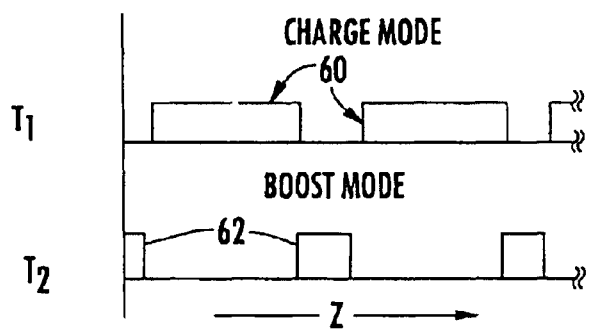
FIG. 2 illustrates the timing wave forms for operating the switches of FIG. 1.

In operation, in the charging mode, as indicated by arrow 50, charging MOS switch 26, switch 28, and switch 34 are closed while switches 30 and 32 are open. This causes the current to flow from $V_{dd}$ through charging MOS switch 26, capacitor 38 and switch 28 to ground, thereby charging capacitor 38 to virtually the supply voltage $V_{dd}$. At this time switch 34 is also closed discharging gate 14 to ground. In the boost mode charging MOS switch 26, switch 28, and switch 34 are open, and switches 30 and 32 are closed. This stacks the voltage now stored on boost capacitor 38 on top of $V_{dd}$, by virtue of switch 30 being closed and applies that voltage along the discharge path as indicated by arrow 52, through closed switch 32 to gate 14 of analog input switch 16. Switches 26–34 are actuated by the timing signals $T_1$ and $T_2$ provided by mode selector circuit 54 which provides both the $T_1$, charge and $T_2$, boost timing signals, as shown in FIG. 2, where as illustrated the charge periods 60 are relatively long compared to the boost periods 62, these relative times are not fixed and charge period 60 may be less than boost period 62.

Figure 3:
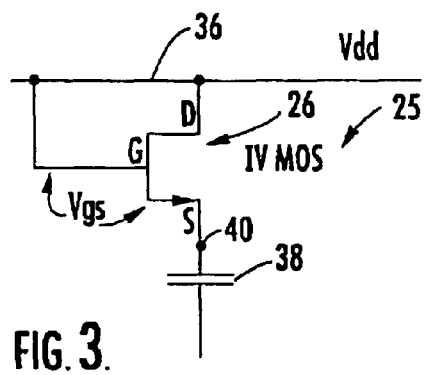
FIG. 3 is a more detailed diagram of the N-type MOS switch illustrating shortcomings in the prior art voltage boost circuits.

One shortcoming of this prior art circuit 10, FIG. 1, is that the gate to source voltage $V_{gs}$, FIG. 3, has a greater and greater effect as the supply voltage $V_{dd}$ becomes lower. For example, a typical gate to source voltage $V_{gs}$ to operate switch 26 is in the order of 1 volt depending on temperature. When the supply voltage $V_{dd}$ is greater than 3 volts this leaves ample headroom for the charging of capacitor 38 so that there is sufficient boost voltage to operate gate 14 of analog input switch 16, FIG. 1. At this stage the device is an NMOS so taking its gate higher than the source will allow it to conduct, the source however will only go as high as a threshold voltage (approximately 1 v) below the gate before conduction will stop. However, in low voltage applications, and presently demands are being made for supply voltages of 1.6 volts and lower, this 1 volt gate to source voltage reduces the available charging voltage for boost capacitor 38 to less than a volt which is insufficient in most instances to operate the analog input switch 16. One approach to overcoming this problem is to provide another voltage boosting circuit which controls the gate of the NMOS switch 26 so that boost capacitor 38 can be charged to a level closer to $V_{dd}$ to meet the demands of operating analog input switch 16. But this requires an additional voltage boosting circuit and a clock circuit for providing a continuous clock signal to charge the booster circuit to maintain at the proper level the gate of the charging NMOS switch 26.

Figure 4:
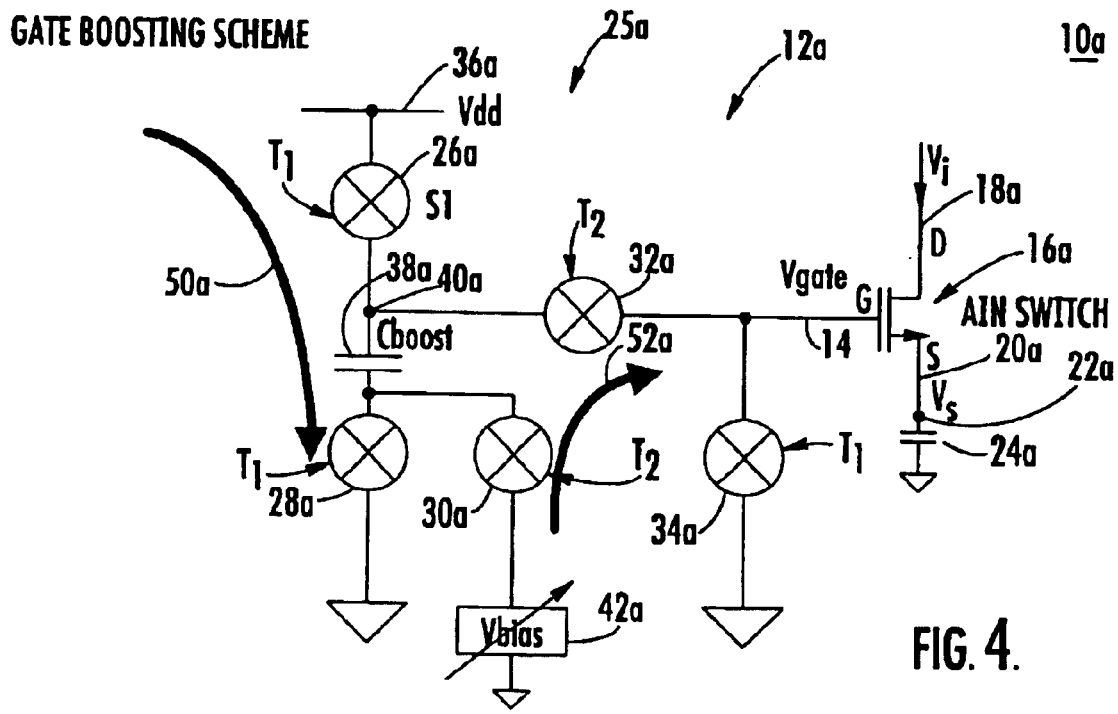
FIG. 4 is a simplified schematic diagram similar to FIG. 1 of a voltage boost circuit in a low supply voltage sampling switch circuit according to this invention.

In accordance with this invention voltage boost circuit 12a, FIG. 4 disposed in low supply voltage sampling switch circuit 10a includes an improved charging circuit 25a. It also includes an independent bias reference 42a which does not depend upon the supply voltage $V_{dd}$ and can be adjusted if desired so that it is always within the optimum operating range for the MOS switches in circuit 10a. The improvement in charging circuit 25a includes the use of an isolation circuit and of a PMOS switch in place of the NMOS switch of the prior art device of FIG. 1. Normally the use of a PMOS switch is avoided because there occurs a forward biasing of the back gate which provides a discharge path that quickly discharges the boost capacitor and destroys its effectiveness as a voltage boost mechanism. FIG. 1 and FIG. 4 use ideal switches which assume high on control signal, switch conducting; low on control signal, switch not conducting. This is fine when the ideal switches are replaced with NMOS as a high on the gate of an NMOS means that the switch is conducting and low on the gate means the switch is not conducting. However, when the replacements are PMOS a control signal in the opposite phase is needed; that is, a low on the gate causes the PMOS to conduct and high on the gate causes the PMOS not to conduct. Thus the signals $T_1$ and $T_2$ are inverted.

Figure 5:
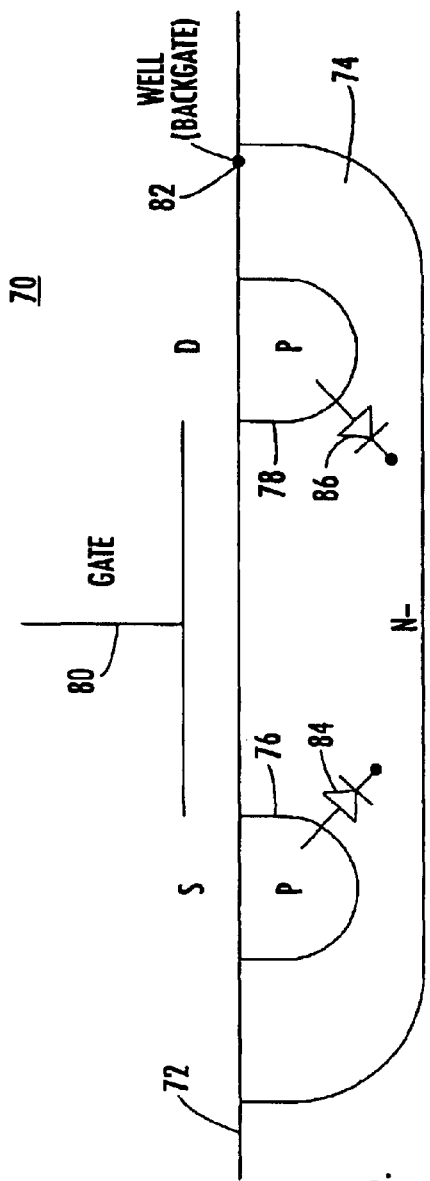
FIG. 5 is a detailed cross sectional schematic view of the charging MOS showing the P and N-well structures.
Figure 6:
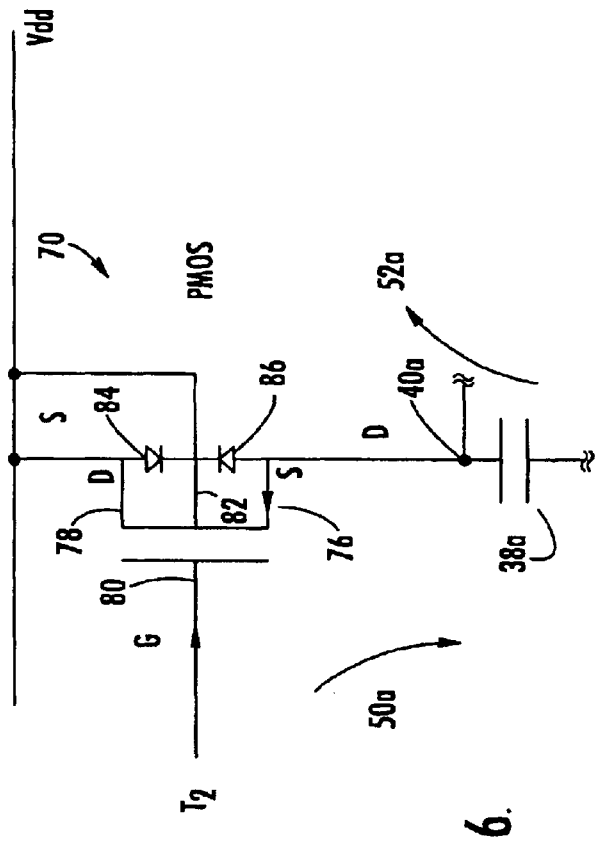
FIG. 6 is a schematic diagram of the charging MOS of FIG. 5 illustrating the problem during the boost phase.

This can be seen more readily with respect to FIGS. 5 and 6. Typical PMOS switch 70, FIG. 5 is constructed in a substrate 72 using an N- well 74 in which are located two P wells 76 as the source and 78 as the drain between which extends the gate 80. The construction as shown results in an inherent diode 84 between source P well 76 and the N- well 74 and another diode 86 between the drain P well 78 and N- well 74. Thus, in the charging mode, FIG. 6, when PMOS switch 70 is on, charging current moves from supply voltage $V_{dd}$ through drain 78 to source 76 to charge boost capacitor 38a. But when charging, PMOS switch 70 is off and boost capacitor 38a is fully charged and stacked with a bias voltage $V_{bias}$ of bias circuit 42a, this voltage which is higher even then the supply voltage $V_{dd}$, forward biases diode 86 which establishes a path to $V_{dd}$ and quickly discharges the boost voltage from boost capacitor 38 before it can be used effectively to operate the gate 14 of analog input switch 16.

Figure 7:
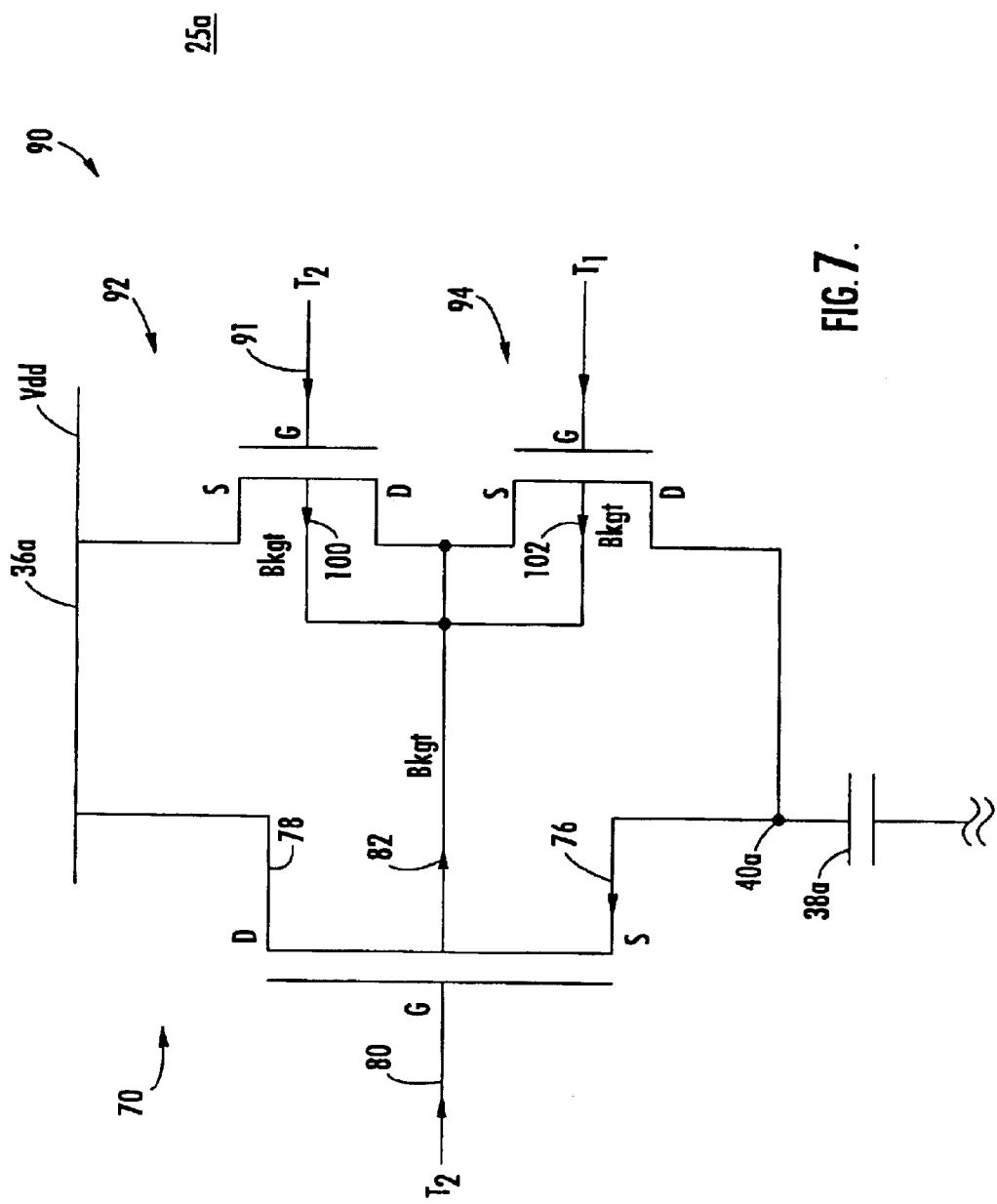
FIG. 7 is a detailed schematic diagram of the charging MOS switch of FIGS. 5 and 6 with the back gate isolating circuit according to this invention.
Figure 8:
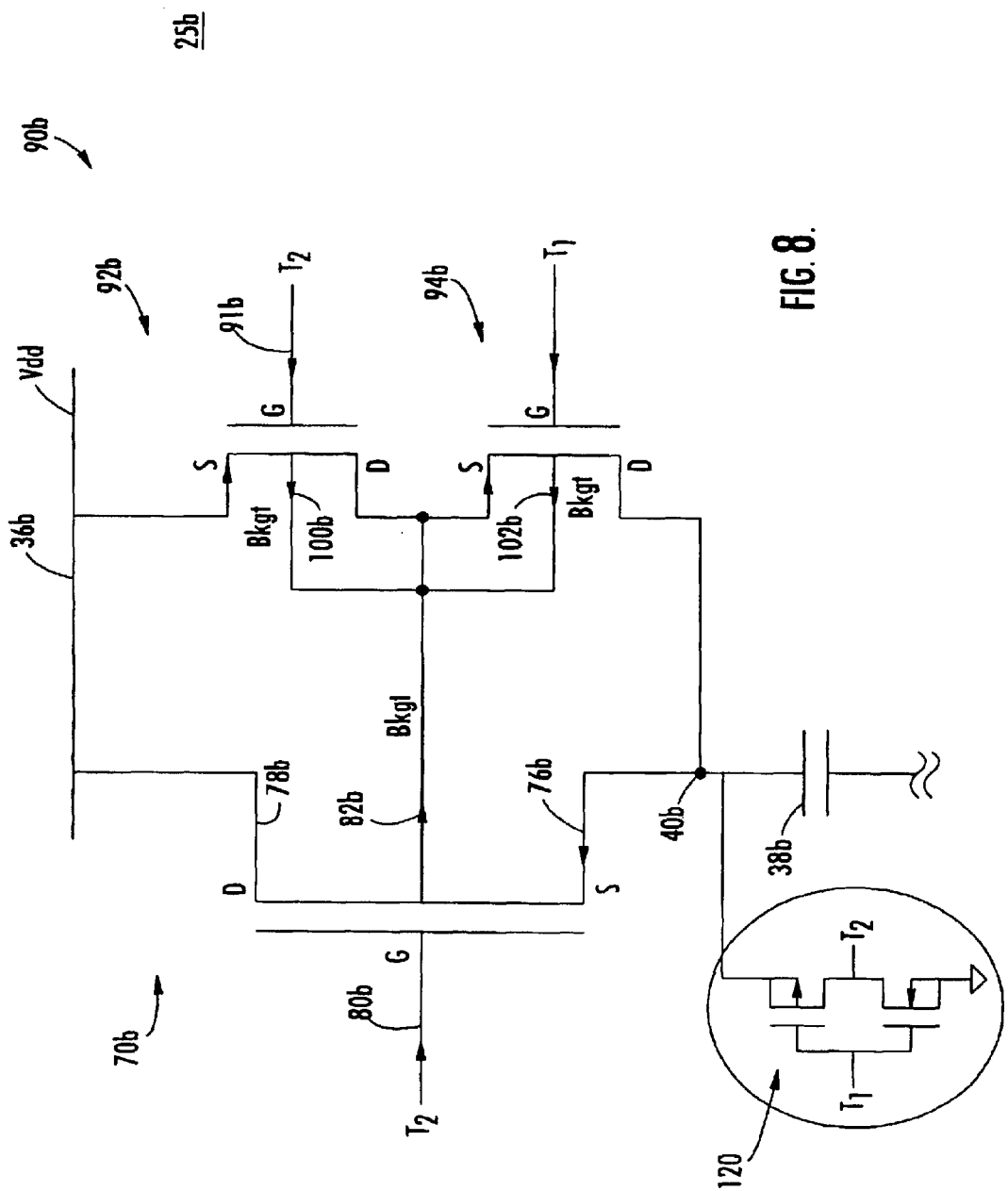
FIG. 8 is the same view as FIG. 7 but also including the driving circuit according to this invention.

To overcome this, in accordance with this invention, an isolation circuit 90, FIG. 7 which includes in addition to PMOS switch 70, two somewhat smaller PMOS switches, switch 92 which interconnects back gate 82 with supply line 36a voltage $V_{dd}$, and switch 94 which interconnects back gate 82 with the source of MOS switch 70 at terminal 40a of boost capacitor 38a. Thus, in the charge mode, $T_1$ when MOS switch 70 is turned on, switch 92 is also turned on to back bias the back gate during the charging mode. Then, during the boost mode, switches 70 and 92 are turned off and switch 94 is turned on to back bias the back gate during the boost mode to prevent discharging of boost capacitor 38 through the back gate of switch 70. To ensure that the back gates 100, 102, FIG. 8, of switches 92 and 94 do not also provide a discharge path during the boost mode, those back gates 100, 102 are connected with the back gate 82 of switch 70. To stop PMOS 70 conducting it is also a requirement that the gate 80 of PMOS 70 be at a voltage at least as high as the higher of the terminals 78 and 76. In boost mode this requires a voltage greater than the supply. Another part of the invention which is a solution to this is to connect the supplies of the last stage of the driving circuit, inverter circuit 120 in FIG. 8, between the boost capacitor 40a and ground. During the boost phase this will guarantee that the driving voltage onto the gate 80 of 82 and the gate 91 of 92 is at the boost voltage.

In the illustrative description thus far in FIG. 4, the analog input switch 16a is depicted as an NMOS switch as are switches 28a and 30a. Switch 32a is a PMOS switch and switch 34a is an NMOS switch and the charging circuit 25a switches 70, 92 and 94 are PMOS switches wherein the power supply $V_{dd}$ is a positive power supply. However, if the power supply $V_{dd}$ were negative, then all of the polarities of the transistor switches would be reversed. That is, the analog input switch would be a PMOS as would switches 28a and 30a. Switch 32a would be an NMOS and switch 34a would be a PMOS. Switches 70, 92 and 94 while implemented with PMOS's for a positive power supply would be implemented as NMOS's for a negative power supply.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A voltage boost circuit comprising:
   a boost capacitor;
   a charging circuit for charging in the charging mode said boost capacitor to a supply voltage;
   said charging circuit including a charging MOS switch interconnected between the supply voltage and one terminal of said boost capacitor and a back gate isolation circuit connected to the back gate of said charging MOS switch and including a first switch for connecting said back gate to said supply voltage for reverse biasing said back gate in the charging mode and a second switch for connecting said back gate to said one terminal of said boost capacitor for reverse biasing the back gate in the boost mode to prevent charge loss from the boost capacitor;
   a boost bias voltage and a boost switch for connecting the second terminal of said boost capacitor to said boost bias voltage in the boost mode; and
   a driving circuit having at least one stage with its supply connected to one terminal of the boost capacitor for providing driving levels of the correct voltage to the charging MOS switch in both the charging mode and the boost mode.

2. The voltage boost circuit of claim 1 in which said supply voltage is positive and said charging MOS switch includes a PMOS switch.

3. The voltage boost circuit of claim 1 in which said supply voltage is negative and said charging MOS switch includes an NMOS switch.

4. The voltage boost circuit of claim 1 in which said first and second switches each have their back gate connected to said back gate of said charging MOS switch.

5. The voltage boost circuit of claim 1 in which said boost bias voltage is an independent reference voltage.

6. The voltage boost circuit of claim 5 in which said boost bias voltage is adjustable.

7. A low supply voltage sampling switch circuit with a voltage boost circuit comprising:
   a boost capacitor;
   a charging circuit for charging in the charging mode said boost capacitor to a supply voltage, said charging circuit including a charging MOS switch interconnected between the supply voltage and one terminal of said boost capacitor and a back gate isolation circuit connected to the back gate of said charging MOS switch and including a first switch for connecting said back gate to said supply voltage for reverse biasing said back gate in the charging mode and a second switch for connecting said back gate to said one terminal of said boost capacitor for reverse biasing the back gate in the boost mode to prevent charge loss from the boost capacitor;
   a boost bias voltage and a boost switch for connecting the second terminal of said boost capacitor to said boost bias voltage in the boost mode; an MOS sampling switch;
   a boost switch for interconnecting in said boost mode said one terminal of said boost capacitor with the gate of said sampling switch for maintaining said sampling switch in the conducting state; and
   a driving circuit having at least one stage with its supply connected to one terminal of the boost capacitor for providing driving levels of the correct voltage to the charging MOS switch in both the charging mode and the boost mode.

8. The low supply voltage sampling switch circuit of claim 7 in which said supply voltage is positive, said charging MOS switch includes a PMOS switch and said charging MOS sampling switch includes an NMOS switch and said sampling switch conducts even at higher input voltages.

9. The low supply voltage sampling switch circuit of claim 7 in which said supply voltage is negative, said charging MOS switch is an NMOS switch and said charging MOS sampling switch is a PMOS switch and said sampling switch conducts even at lower input voltages.

10. The low supply voltage sampling switch circuit of claim 7 in which said first and second switches each have their back gates connected to said back gate of said charging MOS switch.

11. The low supply voltage sampling switch circuit of claim 7 in which said boost bias voltage is an independent reference voltage.

12. The low supply voltage sampling switch circuit of claim 7 in which boost bias voltage is adjustable.

13. A voltage boost circuit comprising:

a boost capacitor;

a charging circuit for charging in the charging mode said boost capacitor to a supply voltage;

said charging circuit including a charging MOS switch interconnected between the supply voltage and one terminal of said boost capacitor and a back gate isolation circuit connected to the back gate of said charging MOS switch and including a first switch for connecting said back gate to said supply voltage for reverse biasing said back gate in the charging mode and a second switch for connecting said back gate to said one terminal of said boost capacitor for reverse biasing the back gate in the boost mode to prevent charge loss from the boost capacitor; and a boost bias voltage and a boost switch for connecting the second terminal of said boost capacitor to said boost bias voltage in the boost mode, wherein said boost bias voltage is an independent reference voltage.

14. The voltage boost circuit of claim 13 in which said boost bias voltage is adjustable.

15. A low supply voltage sampling switch circuit with a voltage boost circuit comprising:

a boost capacitor;

a charging circuit for charging in the charging mode said boost capacitor to a supply voltage, said charging circuit including a charging MOS switch interconnected between the supply voltage and one terminal of said boost capacitor and a back gate isolation circuit connected to the back gate of said charging MOS switch and including a first switch for connecting said back gate to said supply voltage for reverse biasing said back gate in the charging mode and a second switch for connecting said back gate to said one terminal of said boost capacitor for reverse biasing the back gate in the boost mode to prevent charge loss from the boost capacitor;

a boost bias voltage and a boost switch for connecting the second terminal of said boost capacitor to said boost bias voltage in the boost mode, wherein said boost bias voltage is an independent reference voltage; an MOS sampling switch; and a boost switch for interconnecting in said boost mode said one terminal of said boost capacitor with the gate of said sampling switch for maintaining said sampling switch in the conducting state.

16. The low supply voltage sampling switch circuit of claim 15 in which said boost bias voltage is adjustable.

17. The voltage boost circuit of claim 1 in which said boost bias voltage is adjustable.

18. The low supply voltage sampling switch circuit of claim 7 in which said boost bias voltage is adjustable.

* * * * *